US010601368B2

(12) United States Patent
Lu (10) Patent No.: US 10,601,368 B2
(45) Date of Patent: Mar. 24, 2020

(54) SOLID STATE MICROWAVE GENERATOR

(71) Applicant: Seagate Technology LLC, Cupertino, CA (US)

(72) Inventor: Bin Lu, San Ramon, CA (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 149 days.

(21) Appl. No.: 15/237,081

(22) Filed: Aug. 15, 2016

(65) Prior Publication Data

US 2017/0338828 A1      Nov. 23, 2017

Related U.S. Application Data

(60) Provisional application No. 62/339,026, filed on May 19, 2016.

(51) Int. Cl.
*H03B 15/00* (2006.01)
*H03B 5/00* (2006.01)

(52) U.S. Cl.
CPC ............ *H03B 5/00* (2013.01); *H03B 15/006* (2013.01)

(58) Field of Classification Search
CPC .......... H03B 15/00; H03B 15/006; H03L 7/26
USPC ........................................................ 331/94.1
See application file for complete search history.

(56) References Cited

U.S. PATENT DOCUMENTS

| 8,098,105 | B2* | 1/2012 | Cyrille | B82Y 25/00 257/421 |
|---|---|---|---|---|
| 8,421,545 | B2* | 4/2013 | Kim | H03B 15/006 257/421 |
| 8,471,640 | B2* | 6/2013 | Choi | H03B 15/006 331/185 |
| 8,598,957 | B2* | 12/2013 | Lee | H01L 27/22 331/187 |
| 8,754,717 | B2* | 6/2014 | Lee | B82Y 25/00 331/187 |
| 8,847,692 | B2* | 9/2014 | Pi | H03B 15/006 331/3 |
| 9,088,243 | B2* | 7/2015 | Tulapurkar | H03B 15/006 |
| 9,123,884 | B2* | 9/2015 | Luo | H01L 43/08 |
| 9,461,586 | B2* | 10/2016 | Locatelli | H03B 15/006 |
| 9,660,582 | B2* | 5/2017 | Wang | H03B 15/006 |
| 9,762,182 | B2* | 9/2017 | Suzuki | H03B 15/006 |
| 2008/0031035 | A1* | 2/2008 | Rodmacq | H01F 10/3236 365/171 |
| 2008/0080100 | A1 | 4/2008 | Sato et al. | |

(Continued)

OTHER PUBLICATIONS

Braganca et al., "Nanoscale Magnetic Field Detection Using a Spin Torque Oscillator," 2010 Nanotechnology vol. 21. 7 pages.

*Primary Examiner* — Levi Gannon
(74) *Attorney, Agent, or Firm* — Holzer Patel Drennan (57) ABSTRACT

A spin torque oscillation generator includes a spin reference layer and a spin oscillation layer. The spin reference layer has a first magnetization direction. The spin reference layer is configured to receive a current and generate a spin-polarized current. The spin oscillation layer has a second magnetization direction. The second magnetization direction is different than the first magnetization direction. The spin oscillation layer is configured to receive the spin-polarized current from the spin reference layer. The spin-polarized current generates a spin torque based on the second magnetization direction of the spin oscillation layer. The spin torque generates a spin torque output signal.

18 Claims, 7 Drawing Sheets

(56) References Cited

U.S. PATENT DOCUMENTS

| | | | |
|---|---|---|---|
| 2008/0150643 A1* | 6/2008 | Suzuki | H01L 43/08 331/107 R |
| 2009/0201614 A1 | 8/2009 | Kudo et al. | |
| 2010/0079919 A1 | 4/2010 | Nagasawa et al. | |
| 2010/0142088 A1* | 6/2010 | Iwasaki | G11B 5/314 360/110 |
| 2010/0328799 A1 | 12/2010 | Braganca et al. | |
| 2011/0141629 A1 | 6/2011 | Braganca et al. | |
| 2012/0126904 A1 | 5/2012 | Lee et al. | |
| 2012/0154063 A1* | 6/2012 | Nikonov | H01L 43/08 331/94.1 |
| 2012/0218667 A1* | 8/2012 | Nagasawa | H01L 43/08 360/324.11 |
| 2013/0009712 A1 | 1/2013 | Braganca et al. | |
| 2013/0148223 A1 | 6/2013 | Braganca et al. | |
| 2013/0224521 A1* | 8/2013 | Wang et al. | G11B 5/66 428/828 |
| 2014/0168812 A1 | 6/2014 | Braganca et al. | |
| 2015/0303873 A1* | 10/2015 | Park | G01R 33/093 331/94.1 |
| 2015/0372687 A1* | 12/2015 | Buhrman | H03B 15/006 331/94.1 |

* cited by examiner

SOLID STATE MICROWAVE GENERATOR

RELATED APPLICATIONS

The instant application claims the benefit and priority to the U.S. Provisional Patent Application No. 62/339,026 filed on May 19, 2016, which is incorporated in its entirety by reference.

BACKGROUND

Solid state microwave oscillators are used as sensors, communication sources, and measuring instruments in a wide variety of applications, such as, for example, radio communications, military and commercial radar sources, anti-lock brakes, airborne collision avoidance radar, traffic flow monitoring, automatic traffic gates, process control equipment, alarms, train derailment sensors, vibration detectors, tachometers, and moisture content monitors, to name just a few. Current solid state oscillators have a limited output (e.g., field-effect transistors are limited to 0.3 GHz), have bulky/large layouts, and/or utilize high power and high voltage to generate a microwave output. For example, Gunn diodes have physical dimensions of inches, which is too bulky for microelectronic applications, medical devices, mobile devices, robotic engineering devices, internet-of-things devices, and/or other devices requiring micro-sized layouts.

SUMMARY

Provided herein are various embodiments of a microwave generator including a spin torque oscillation generator. The spin torque oscillation generator includes a spin reference layer and a spin oscillation layer. The spin reference layer has a first magnetization direction. The spin reference layer is configured to receive a current and generate a spin-polarized current. The spin oscillation layer has a second magnetization direction. The second magnetization direction is different than the first magnetization direction. The spin oscillation layer is configured to receive the spin-polarized current from the spin reference layer. The spin-polarized current generates a spin torque based on the second magnetization direction of the spin oscillation layer. The spin torque generates a microwave output signal.

In various embodiments, a microwave generator including at least a first spin torque oscillation generator and a second spin torque oscillation generator is disclosed. Each of the spin torque oscillation generators include a spin reference layer and a spin oscillation layer. The spin reference layer has a first magnetization direction. The spin reference layer is configured to receive a current and generate a spin-polarized current. The spin oscillation layer has a second magnetization direction. The second magnetization direction is different than the first magnetization direction. The spin oscillation layer is configured to receive the spin-polarized current from the spin reference layer. The spin-polarized current generates a spin torque based on the second magnetization direction of the spin oscillation layer. The spin torque generates a microwave output signal. A transmitter is coupled to first spin torque oscillation generator and the second spin torque oscillation generator.

In various embodiments, a method of generating a microwave output signal using at least a first spin torque oscillation generator and a second spin torque oscillation generator is disclosed. A current is received in a spin reference layer in each of a first spin torque oscillation generator and a second spin torque oscillation generator. The spin reference layers each have a first magnetization direction. A spin-polarized current is generated in each of the spin reference layers by passing the current through the spin reference layer. A spin torque is generated in a spin oscillation layer of each of the first and second spin torque oscillation generators. The spin oscillation layer has a second magnetization direction different from the first magnetization direction. The spin torque generates precession of a plurality of electrons in the spin oscillation layer. The precession generates an electromagnetic wave output signal. A microwave output signal is generated by aggregating of each of the electromagnetic wave output signals.

DETAILED DESCRIPTION

Before some particular embodiments are described in greater detail, it should be understood by persons having ordinary skill in the art that the particular embodiments described and/or illustrated herein do not limit the concepts presented herein, as elements in such particular embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing some particular embodiments, and the terminology does not limit the concepts presented herein. Unless indicated otherwise, ordinal numbers (e.g., first, second, third, etc.) are used to distinguish or identify different elements or steps in a group of elements or steps, and do not supply a serial or numerical limitation. For example, "first," "second," and "third" elements or steps of embodiments need not necessarily appear in that order, and embodiments need not necessarily be limited to the three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art.

In various embodiments, a solid state microwave generating apparatus is disclosed. The solid state microwave generating apparatus includes a spin reference layer and a spin oscillation layer. The spin reference layer is a permanent magnetic layer having a first magnetization direction. The spin reference layer receives a current and generates a spin-polarized current. The spin polarized current is provided to the spin oscillation layer. The spin oscillation layer is a magnetic layer having a second magnetization direction. The spin-polarized current generates a spin torque on the spins of the spin oscillation layer. The spin torque causes the spins of the spin oscillation layer to precess. The precession of the spins a microwave output signal.

Figure 1:
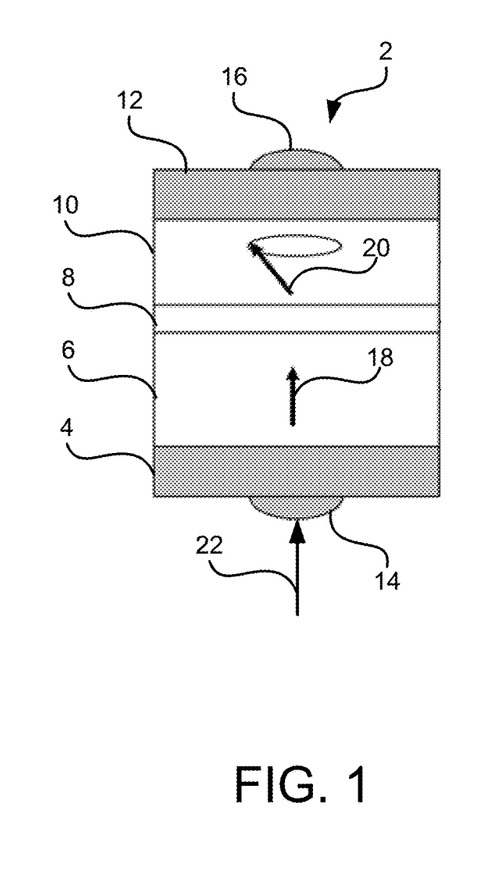
FIG. 1 provides a schematic diagram of a spin torque oscillation generator, in accordance with some embodiments.

FIG. 1 provides a schematic diagram of a spin torque oscillation generator 2, in accordance with some embodiments. The spin torque oscillation generator 2 includes a first electrode 4 configured to receive a current 22. A contact 14 can be formed on the first electrode 4. The contact 14 is configured to couple the first electrode 4 to one or more additional circuit elements, such as, for example, a current source. The first electrode 4 comprises a conductive material configured to pass the current 22 from the contact 14 to one or more additional layers. For example, in various embodiments, the first electrode 4 can comprise any suitable material such as a silver-alloy, a copper alloy, a gold alloy, an aluminum alloy, and/or any other suitable material having a high electrical conductivity. In some embodiments, the current 22 has a high current density. For example, in some embodiments, the current 22 has a current density of about $10^7$ A/cm$^2$, although it will be appreciated that a greater and/or lesser current density can be used and is within the scope of this disclosure. A spin reference layer 6 is formed above the first electrode 4 and receives a current 22 from the first electrode 4. In the illustrated embodiment, the spin reference layer 6 is formed directly above the first electrode 4, although it will be appreciated that one or more additional layers can be formed between the first electrode 4 and the spin reference layer 6.

In some embodiments, the spin reference layer 6 includes a permanent magnetic material having a first magnetization direction 18. The first magnetization direction 18 generates an energy band/preference in the spin reference layer 6. The spin reference layer 6 receives a current 22 from the first electrode 4 and generates a spin-polarized current based on the energy band/preference. In some embodiments, the spin-polarized current is generated by filtering electrons passing through the spin reference layer 6 such that electrons having a spin direction substantially similar to the first magnetization direction 18 are passed through the spin reference layer 6 and electrons having a spin direction substantially opposite the first magnetization direction 18 are not-passed through (e.g., reflected back or scattered). This filtering generates a spin-polarized current having a spin polarization direction substantially equal to the first magnetization direction 18.

The spin reference layer 6 can comprise any suitable permanent magnetic material. In some embodiments, the spin reference layer 6 includes a hard permanent magnetic material configured to maintain a predetermined first magnetization direction 18 in the presence of an external magnetic field (see FIG. 3). For example, the spin reference layer 6 can comprise an $L1_0$-phased hard magnetic alloy, such as FePt, FePtX, CoPt, CoPtX, FePd, FePdX, CoPdX, where X is any other suitable additional element(s), and/or any other suitable element. The spin reference layer 6 can be formed into arrays by any suitable formation method, such as bit-pattern media technology, although it will be appreciated that the spin reference layer 6 can be formed by one or more additional and/or alternative methods, for example, lithographic methods.

In some embodiments, the spin torque oscillation generator 2 includes an exchange breaking layer 8 formed above the spin reference layer 6. The exchange breaking layer 8 is configured to pass the spin-polarized current (i.e., pass spin-polarized electrons) from the spin reference layer 6 to one or more additional layers, such as a spin oscillation layer 10, formed above the exchange breaking layer 8. The exchange breaking layer 8 further breaks a magnetic exchange/coupling between the spin reference layer 6 and one or more additional layers, such as the spin oscillation layer 10. The exchange breaking layer 8 includes a conducting, nonmagnetic or weak magnetic material, such as, for example, a copper-alloy, a silver-alloy, a gold-alloy, and/or any other suitable conducting, nonmagnetic or weak magnetic alloy. The exchange breaking layer 8 can be formed by any suitable formation method, such as bit-pattern media technology, although it will be appreciated that the exchange breaking layer 8 can be formed by one or more additional and/or alternative methods. In some embodiments, the exchange breaking layer 8 can include a diffusion barrier layer (not shown). Although the exchange breaking layer 8 is illustrated directly above the spin reference layer 6, it will be appreciated that one or more additional layers can be formed between the spin reference layer 6 and the exchange breaking layer 8.

In some embodiments, a spin oscillation layer 10 is formed on top of the exchange breaking layer 8. The spin oscillation layer 10 includes a permanent magnetic layer having a second magnetization direction 20. The second magnetization direction 20 is different than the first magnetization direction 18. The spin oscillation layer 10 receives the spin-polarized current from spin reference layer 6, for example, through the exchange breaking layer 8. When the spin-polarized current arrives in the spin oscillation layer 10, the spin-polarized current generates a spin torque in the spins of the oscillation layer 10. The spin torque is dependent on a magnetization angle difference between the second magnetization direction 20 and the spin direction of the spin-polarized current, i.e., the first magnetization direction 18. The spin torque causes precession of the spins within the spin oscillation layer about a film normal of the spin oscillation layer 10. The precession of the spins generates an electromagnetic (EM) wave output signal. The magnetization angle difference between the first magnetization direction 18 and the second magnetization direction 20 can be any suitable angle, for example, any angle within a range of 0° and 90°, such as 5°, 10°, 15°, 30°, 45°, 60°, 75°, 80°, 85°, 90°, a range of 0° and 180°, such as 5°, 10°, 15°, 30°, 45°, 60°, 75°, 80°, 85°, 90°, 105°, 135°, 150°, 180°, and/or any other suitable angle or range of angles. The spin torque can be further dependent on the current density of the spin-polarized current (e.g., the current density determines the strength and frequency of the spin torque output signal). In some embodiments, the spin torque output signal is a microwave signal.

In some embodiments, the second magnetization direction 20 of the spin oscillation layer 10 is determined by an external magnetic field applied to the spin oscillation layer 10. For example, the spin oscillation layer 10 can include a soft magnetic material and/or a negative magnetic anisotropy (Ku) material, such as a nickel alloy (e.g., NiFe, NiCo, NiFeCo), an iron alloy (e.g., FeCo), a cobalt alloy, (e.g., CoIr), and/or any other suitable soft magnetic and/or negative Ku material. Applying an external magnetic field to a soft magnetic material and/or a negative Ku material causes a change in the second magnetization direction 20. For example, in some embodiments, the second magnetization direction 20 aligns at an angle with respect to a film normal when an external magnetic field is applied perpendicular to the film plane. It will be appreciated that the external magnetic field and/or the material of the spin oscillation layer 10 can be selected to achieve any desired orientation of the second magnetization direction 20. A frequency of the spin torque output signal can be tuned dynamically by adjusting the external magnetic field strength and/or a current density of the spin-polarized current. In some embodiments, the frequency of the spin torque output signal is further determined by magnetic properties and magnetic configurations of the spin reference layer 6 and/or the spin oscillation layer 10.

A second electrode 12 is formed on top of the spin oscillation layer 10. The first electrode 4 and/or the second electrode 12 can be formed of any suitable material. For example, the first electrode 4 and/or the second electrode 12 can include a silver alloy, a copper alloy, a gold alloy, an aluminum alloy, and/or any other suitable material having a high electrical conductivity. In some embodiments, the first electrode 4 and/or the second electrode 12 include a seed layer having a face-centered cubic (FCC) structure, a body-centered cubic (BCC) structure, a hexagonal close-packed structure (HCP) and/or any other suitable structure. The seed layer is configured to assist in growth of one or more of the spin reference layer 6, the exchange breaking layer 8, and/or the spin oscillation layer 10. The contact 16 is configured to couple the second electrode 12 to one or more additional circuit elements.

Figure 2:
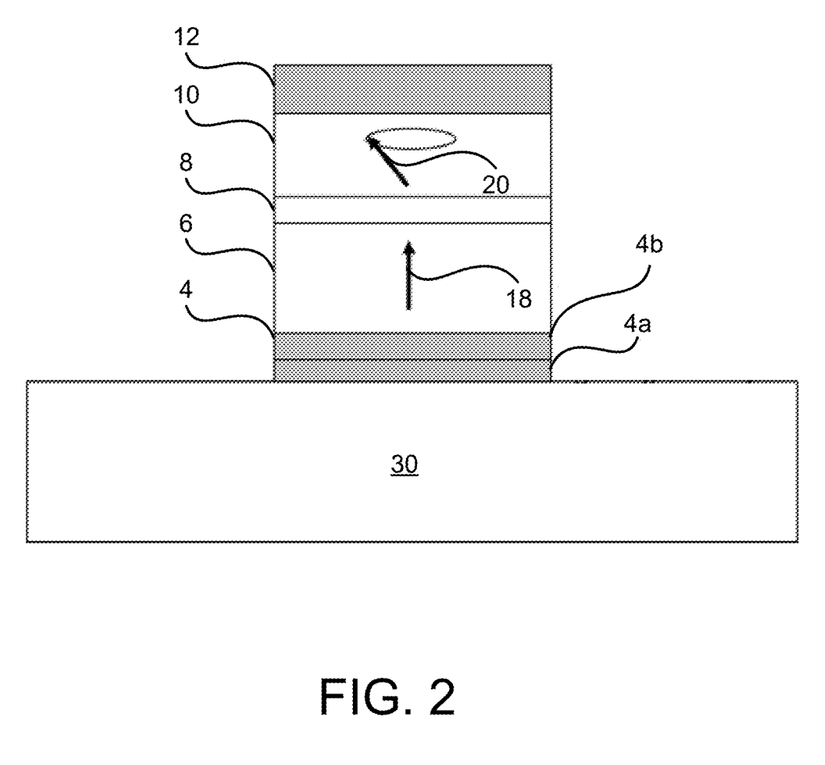
FIG. 2 provides a schematic diagram of a spin torque oscillation generator formed over a substrate, in accordance with some embodiments.

FIG. 2 provides a schematic of a microwave generator 2 disposed on a substrate 30, in accordance with some embodiments. The substrate 30 can include any suitable substrate material, such as a glass, metal, silicon (e.g., single crystalline silicon with (100) orientation) and/or other suitable substrate material. In some embodiments, the first electrode 4 is divided into a first electrode layer 4a and a second electrode layer 4b. The first electrode layer 4a can comprise any suitable electrode material deposited over the substrate 30, such as, for example, a silver-alloy, copper-alloy, gold-alloy, aluminum alloy, and/or other suitable electrode material. In some embodiments, the first electrode layer 4a includes an FCC, BCC, and/or HCP seed layer. The second electrode layer 4b can include an intermediate layer of a ruthenium-alloy, such as Ru, RuCr, and/or RuX, where X stands for any other suitable element or mixture of elements. In some embodiments, the second electrode layer 4b includes a HCP structure. In some embodiments, the spin reference layer 6 includes an HCP structure, for example, a CoPt-alloy, such as, CoPt, CoCrPt, or CoCrPtX, where X stands for any other suitable element or a mixture of any other suitable elements. The thickness of the spin reference layer 6 can range from about 1 nm to about 1000 nm. In some embodiments, the exchange break layer 8 includes an FCC structure-material having a high electrical conductivity, such as, Au-alloys, Pt-alloys, Cu-alloys, Ag-alloys, Al-alloys, and/or other suitable alloys with or without addition of other suitable elements. The thickness of the exchange break layer 8 can range from about 0.5 nm to about 100 nm. In some embodiments, the spin oscillation layer 10 includes a soft magnetic material, such as NiFe, CoFe, NiCo, or NiCoFe alloys (with or without the addition of other suitable elements) and/or negative Ku alloys, such as, Co—Ir alloys (with or without the addition of other suitable elements). As discussed in more detail below, in some embodiments, an external magnetic field is applied to at least the spin oscillation layer 10 to orient the second magnetic direction 20 in a predetermined direction.

In some embodiments, the substrate 30 includes a single crystalline Si substrate (111). One or more high electrical conductivity materials, such as Au, Pt, Ag, Al, and/or suitable alloys thereof, are deposited onto the Si (111) substrate 30 as a seed layer 4a to provide a FCC (111) crystalline thin film. A Ru seed layer 4b can be subsequently deposit onto the seed layer 4a to obtain a Ru (0002) single crystalline thin film. The seed layers 4a, 4b form a first electrode 4. In some embodiments, a layer of permanent magnetic CoPtX alloy, where X can be any suitable element or mixture of elements, having a high magnetic anisotropy is deposited to form a spin reference layer 6. The spin reference layer 6 can include a single crystalline thin film having a (0002) structure and a first magnetic orientation 18. In some embodiments, an exchange breaking layer 8 having a high electrical conductivity, such as, for example, Au, Pt, Ag, Al and/or suitable alloys thereof, is deposited onto the spin reference layer 6. The exchange breaking layer 8 includes a single crystalline thin film having (111) structure. In some embodiments, a spin oscillation layer 10 of $L1_0$-phased FePtX alloy, where X is any suitable element or mixture of elements, is deposited onto the exchange breaking layer 8. The spin oscillation layer 10 includes a single crystalline permanent magnetic thin film having a (111) structure. In some embodiments, the spin reference layer 6 has a first magnetic orientation 18 (e.g., a magnetic easy axis) oriented on a film normal and the spin oscillation layer 10 has a second magnetic orientation (e.g., a magnetic easy axis) 54.75 degree away from a film normal in three existing (110) planes. It will be appreciated that an external magnetic field may not be necessary to obtain a desirable spin oscillation for the spin oscillation layer 10.

The spin torque oscillation generator 2 can have dimensions on a nano and/or micro level scale. For example, in some embodiments, the spin torque oscillation generator 2 is a solid state microwave generator having a lateral dimension of about 20 nm×20 nm. The spin torque oscillation generator 2 be made into arrays with a 40 nm lateral pitch (e.g., 20 nm spin toque oscillation generators 2 having a 20 nm spacing to one or more adjacent spin torque oscillation generators 2 (see FIG. 6)). The spin torque oscillation generator 2 can be configured to generate a spin torque output signal in the microwave range. In some embodiments, the spin torque oscillation generator 2 generates a spin torque output signal having about 0.1 nW of microwave energy, although it will be appreciated that a spin torque oscillation generator 2 having greater and/or lesser dimensions can be configured to output a higher or lower energy. In some embodiments, a plurality of spin torque oscillation generators 2 can be combined to generate a microwave output signal of any desired strength. In some embodiments, a nanometer sized spin torque oscillation generator 2 provides one or more advantages over a micrometer-sized spin torque oscillation generator 2. For example, in some embodiments, the smaller cross-section provides a larger ratio of surface to volume of a metal line which provides better thermal dissipation, although it will be appreciated that nanometer and/or micrometer-sized spin torque oscillation generators 2 can provide additional and/or alternative benefits. The spin torque oscillation generator 2 provides several advantages over traditional microwave generators (such as Gunn diodes), such as smaller size (e.g., spin torque oscillation generator 2 can have an area of about 20 nm versus a 1 cm Gunn diode), broad working temperatures, low dissipation power, large output power, microwave emissions without a magnetic field, high frequencies, and narrow line width, to name just a few. The smaller size of the spin torque oscillation generator 2 (as compared to traditional microwave generators) makes the spin torque oscillation generator 2 ideal for space-restricted uses, such as, for example, medical imaging, tracking, cell phones, solid state devices, and/or any other space-restricted or space-dependent application.

Figure 3:
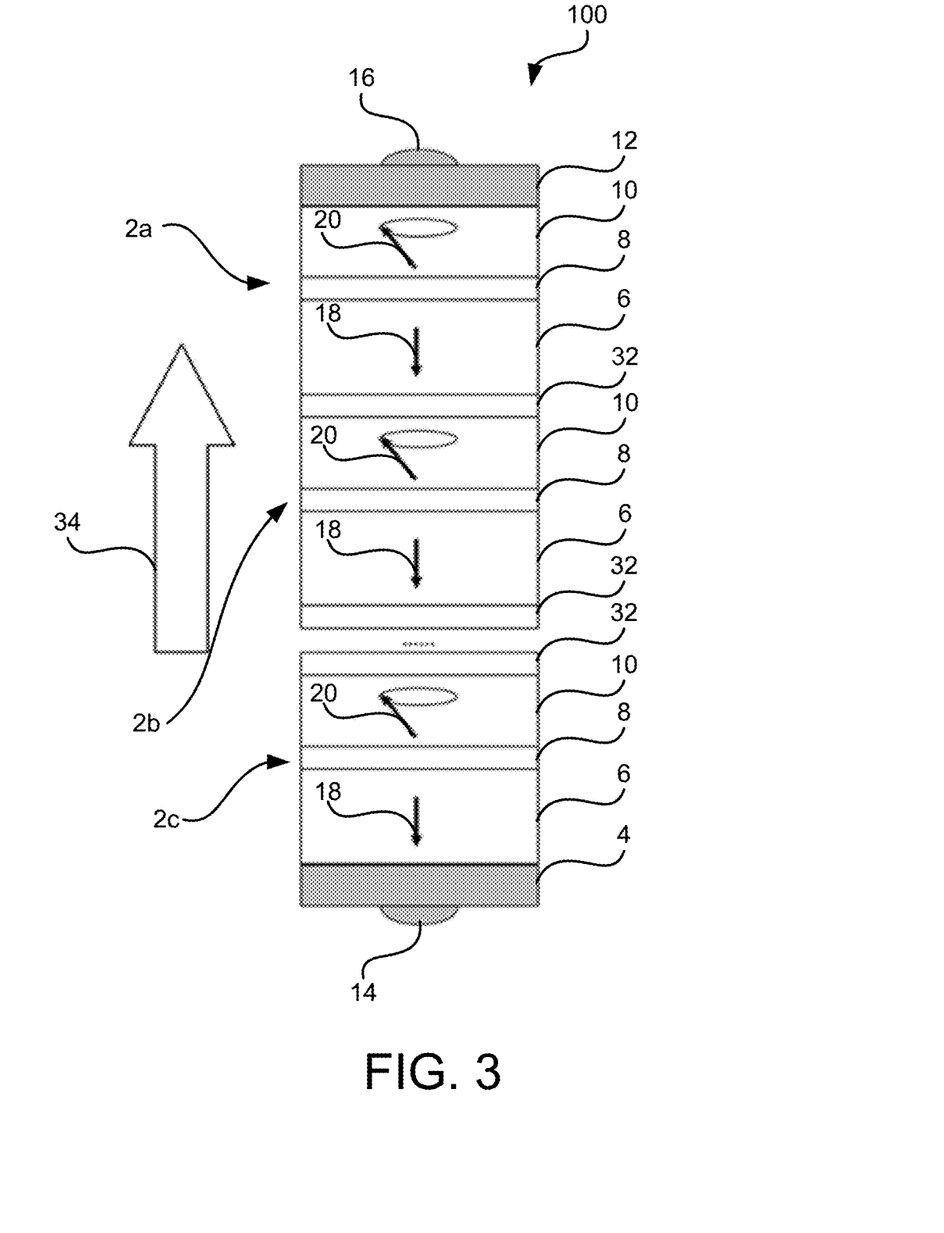
FIG. 3 provides a schematic diagram of an array of stacked spin torque oscillation generators, in accordance with some embodiments.

FIG. 3 provides a schematic diagram of a stacked microwave generator 100 including at least a first spin torque oscillation generator 2a and a second spin torque oscillation generator 2b, in accordance with some embodiments. The stacked microwave generator 100 includes a first spin torque oscillation generator 2a, a second spin torque oscillation generator 2b, and an n-th spin torque oscillation generator 2c. Although three spin torque oscillation generators 2a-2c are illustrated, it will be appreciated that the stacked microwave generator 100 can include any number of vertically stacked spin torque oscillation generators 2. The spin torque oscillation generators 2a-2c are similar to the spin torque oscillation generators 2 illustrated in FIGS. 1-2, and similar description is not repeated herein. In some embodiments, the stacked microwave generators 2a-2c are generated by a lithographic method, a bit-pattern media method, a nano-imprinting method (e.g., using self-organized di-block polymers), and/or any other suitable method.

In some embodiments, the spin torque oscillation generators 2a-2c are separated by additional exchange breaking layers 32 positioned between a spin reference layer 6 of a first spin torque oscillation generator 2a-2c and a spin oscillation layer 10 of a second spin torque oscillation generator 2a-2c. A current is applied at a first electrode 4 and passed through each of the spin oscillation generators 2a-2c. Each of the spin torque oscillation generators 2a-2c are configured to generate spin torque output signals that are substantially additive. For example, in some embodiments, the first magnetization direction 18 of the spin reference layer 6 in each of the spin torque oscillation generators 2a-2c is substantially equal and the second magnetization direction 20 of the spin oscillation layer 10 in each of the spin torque oscillation generators 2a-2c is substantially equal. In other embodiments, although the first magnetization direction 18 and/or the second magnetization direction 20 in each of the spin torque oscillation generators 2a-2c may be different, the magnetization angle difference between the first magnetization direction 18 and the second magnetization direction 20 in each of the spin torque oscillation generators 2a-2c is substantially the same. In other embodiments, the first magnetization direction, the second magnetization direction, and/or the magnetization angle in each of the spin torque oscillation generators 2a-2c can be different from one another. In this embodiment, the spin torque output signals generated by each of the spin torque oscillation generators may only be partially additive. The spin torque output signals of each of the spin torque oscillation generators 2a-2c are aggregated to generate an output signal, such as a microwave output signal.

In some embodiments, the second magnetization direction 20 of each of the spin oscillation layers 10 can be determined by an external magnetic field 34 applied to the stacked microwave generator 100. The external magnetic field 34 can be generated by any suitable magnetic element, such as, for example, a permanent magnet, an electromagnetic, a current path, and/or any combination thereof. The external magnetic field 34 is configured to align at least the second magnetization direction 20 of each of the spin oscillation layers 10 in a predetermined direction. For example, in some embodiments, the external magnetic field 34 aligns the second magnetization direction 20 of each of the spin torque oscillation generators 2a-2c in the same direction. In some embodiments, each of the spin reference layers 6 comprise a hard magnetic material configured to maintain a predetermined first magnetization direction 18, even when exposed to an external magnetic field 34. In other embodiments, the spin reference layers 6 each comprise a material having a different response to an external magnetic field 34.

In some embodiments, the external magnetic field 34 is an adjustable magnetic field. One or more parameters of the external magnetic field 34, such as, for example, the strength of the field, the direction of the field, the location of the field, and/or additional parameters can be adjusted to alter the second magnetization direction 20 of the spin oscillation layer 10. For example, in some embodiments, the external magnetic field 34 is generated by an electromagnet and has an adjustable magnetization direction. The direction of the external magnetic field 34 can be adjusted to provide a predetermined magnetic angle difference between the first magnetization direction 18 of the spin reference layer 6 and the second magnetization direction 20 of the spin oscillation layer 10. In various embodiments, the magnetic angle difference can be adjusted to any suitable degree within the range of 0° and 90°, such as 5°, 10°, 15°, 30°, 45°, 60°, 75°, 80°, 85°, 90°, a range of 0° and 180°, such as 5°, 10°, 15°, 30°, 45°, 60°, 75°, 80°, 85°, 90°, 105°, 135°, 150°, 180°, and/or any other suitable angle or range of angles. In some embodiments, the external magnetic field 34 is adjusted to alter a frequency of an output signal generated by the spin oscillation layer 10. In some embodiments, the external magnetic field 34 can include two or more magnetic fields. For example, in some embodiments, individual external magnetic fields are applied to each of the spin torque oscillation generators 2a-2c. The external magnetic fields are configured to partially overlap only the spin oscillation layer 10 of an associated spin torque oscillation generator 2a-2c without interfering with the spin oscillation layer 10 of adjacent spin torque oscillation generators 2a-2c. In some embodiments, multiple external magnetic fields can overlap one or more of the spin oscillation layers 10.

Figure 4:
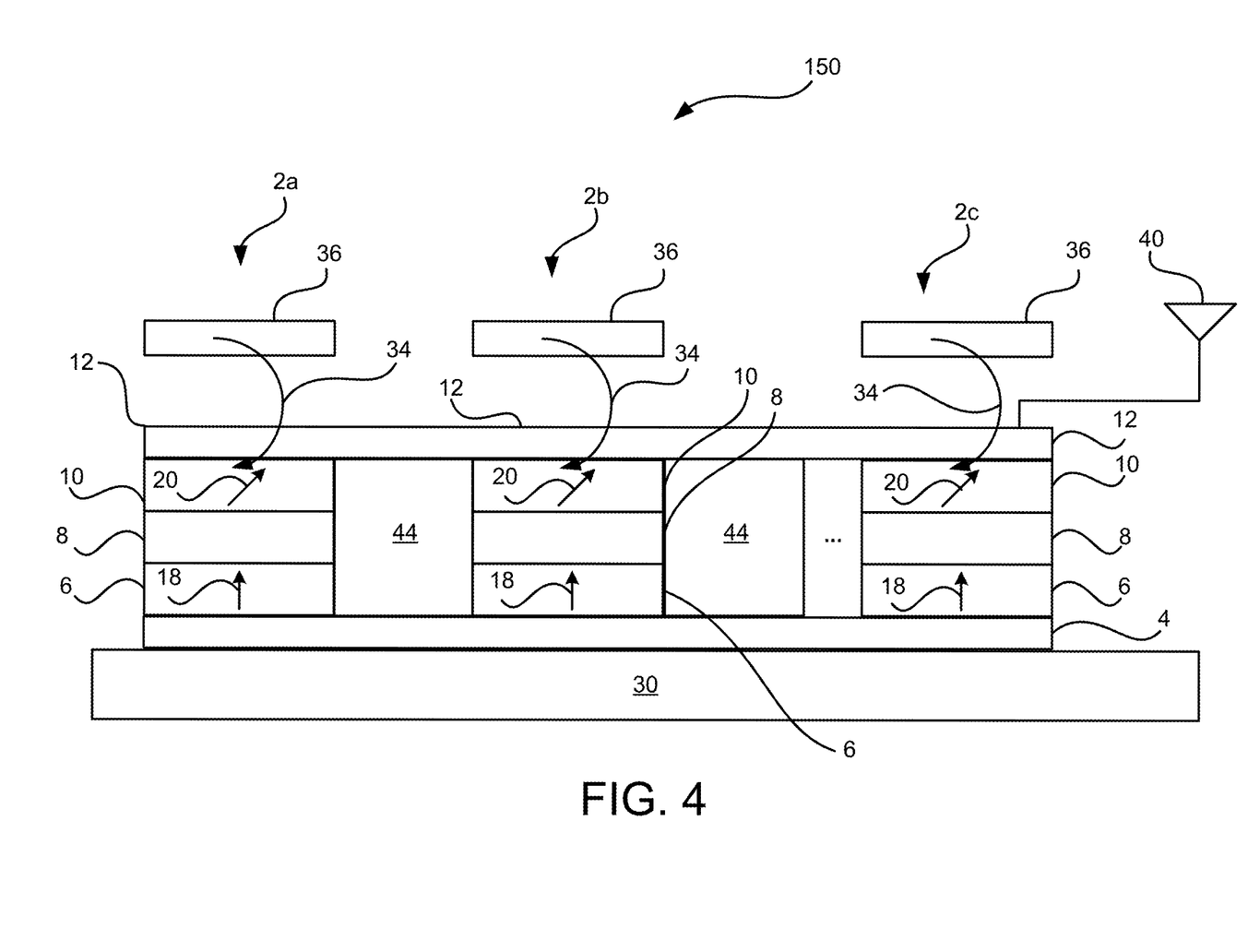
FIG. 4 provides a schematic diagram of an array of side-by-side spin torque oscillation generators, in accordance with some embodiments.

FIG. 4 provides a schematic diagram of an array 150 of spin torque oscillation generators 2a-2c, in accordance with some embodiments. The spin torque oscillation generators 2a-2c are similar to the spin torque oscillation generator 2 described in conjunction with FIG. 1, and similar description is not repeated herein. The first electrode 4 and the second electrode 12 each include a continuous thin film coupled to each of the spin torque oscillation generators 2a-2c. The spin torque oscillation generators 2a-2c are arranged in an adjacent configuration on a substrate 30 and are coupled in parallel. In some embodiments, the spin torque oscillation generators 2a-2c are separated by one or more insulators 44. The insulators 44 can include thermal conducting single crystal or polycrystalline oxide(s) that electrically insulate the current in each of the spin torque oscillation generators 2a-2c. The insulators 44 efficiently dissipate ohm heating of the spin torque oscillation generators 2a-2c under high current density. Each of the spin torque oscillation generators 2a-2c may have a corresponding a magnetic element 36 associated therewith in order to apply the external magnetic field to the spin torque oscillation generator in order to align the second magnetization direction 20 of an associated spin oscillation layer 10 in a predetermined direction. The magnetic element 36 is configured to generate an external magnetic field 34 that at least partially overlaps the spin oscillation layer 10 of the associated spin torque oscillation generators 2a-2c. Although individual magnetic elements 36 are illustrated, it will be appreciated that one or more of the spin torque oscillation generators 2a-2c can share one or more continuous and/or discrete magnetic generators.

Each of the magnetic elements 36 is configured to align the second magnetization direction 20 of an associated spin oscillation layer 10 in a predetermined direction. For example, in some embodiments, each of the magnetic elements 36 is configured to align the second magnetization direction 20 of each of the spin torque oscillation generators 2a-2c in substantially the same direction. In some embodiments, each of the magnetic elements 36 provides an adjustable external magnetic field 34 such that the second magnetization direction 20 of each of the spin oscillation layers 10 (and therefore the electromagnetic wave output signal) can be adjusted independently. In some embodiments, each of the magnetic elements 36 are independently adjusted such that a magnetization angle between the first magnetization direction 18 and the second magnetization direction 20 in each of the spin-torque oscillation generators 2a-2c are substantially equal. In various embodiments, the magnetization angle between the first magnetization direction 18 and the second magnetization direction 20 in each of the spin torque oscillation generators 2a-2c can be any angle within the range of 0° to 180°, such as 5°, 10°, 15°, 30°, 45°, 60°, 75°, 90°, 120°, 150°, 180°, and/or any other suitable angle.

In some embodiments, the spin torque oscillation generators 2a-2c are coupled to a transmitter 40 configured to transmit an aggregate microwave output signal. The aggregate microwave output signal is generated by combining the electromagnetic wave output signals of each of the spin torque oscillation generates 2a-2c. In some embodiments, the transmitter 40 can include a microwave cavity, a waveguide, and/or any other suitable transmission elements.

Figure 5:
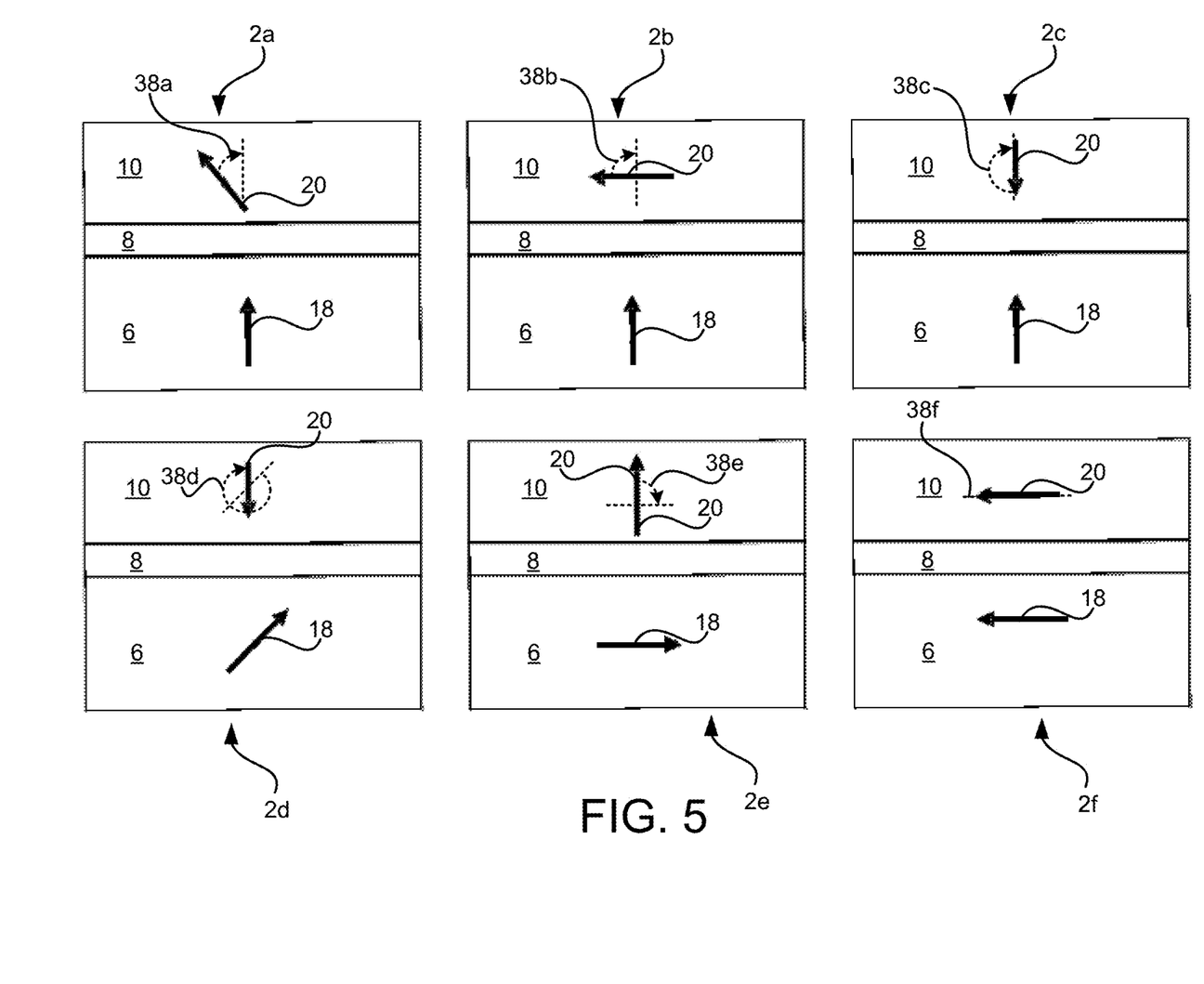
FIG. 5 provides a schematic diagram of various spin torque oscillators having a plurality of first and second magnetization directions, in accordance with some embodiments.

FIG. 5 provides a schematic diagram of various spin torque oscillation generators 2a-2f having a plurality of first and second magnetization directions 18, 20, in accordance with some embodiments. As shown in FIG. 5, magnetic decoupling between the spin reference layer 6 and the spin oscillation layer 10 (for example, as provided by the exchange breaking layer 8) allows the spin torque oscillation generator 2a-2f to generate a spin torque output signal at any magnetization angle within the range of 0° to 180°. For example, the first spin torque oscillation generator 2a, second spin torque oscillation generator 2b, and the third spin torque oscillation generator 2c each have a first magnetization direction 18 in an "up" direction. The first spin torque oscillation generator 2a has a second magnetization direction 20 offset at a substantially 45° angle (magnetization angle 38a), the second spin torque oscillation generator 2b has a second magnetization direction 20 offset at substantially a 90° angle (magnetization angle 38b), and the third spin torque oscillation generator 2c has a second magnetization direction 20 offset at substantially a 180° angle (magnetization angle 38c).

In some embodiments, the first magnetization direction 18 can vary between spin torque oscillation generators 2a-2f. For example, the fourth spin torque oscillation generator 2d has a first magnetization direction 18 offset at a 45° angle from an "up" direction and a second magnetization direction 20 in a substantially "down" direction, providing a magnetization angle 38d of about 135°. As another example, the fifth spin torque oscillation generator 2e has a first magnetization direction in a substantially "right" direction and a second magnetization direction 20 in a substantially "up" direction, providing a magnetization angle 38e of about 90°. As a third example, the sixth spin torque oscillation generator 2f has a first magnetization direction in a substantially "left" direction and a second magnetization direction 20 in a substantially "left" direction, providing a magnetization angle 38e of about 0°. Although various illustrative embodiments of first magnetization directions 18 and second magnetization directions 20 are provided herein, it will be appreciated that the first magnetization direction 18 and/or the second magnetization direction can have any orientation and have any angle of difference within a range of 0° to 180°. It is appreciated that the output of each spin torque oscillation generator may be combined with other in any desired configuration, e.g., parallel, series, or any combination thereof.

Figure 6:
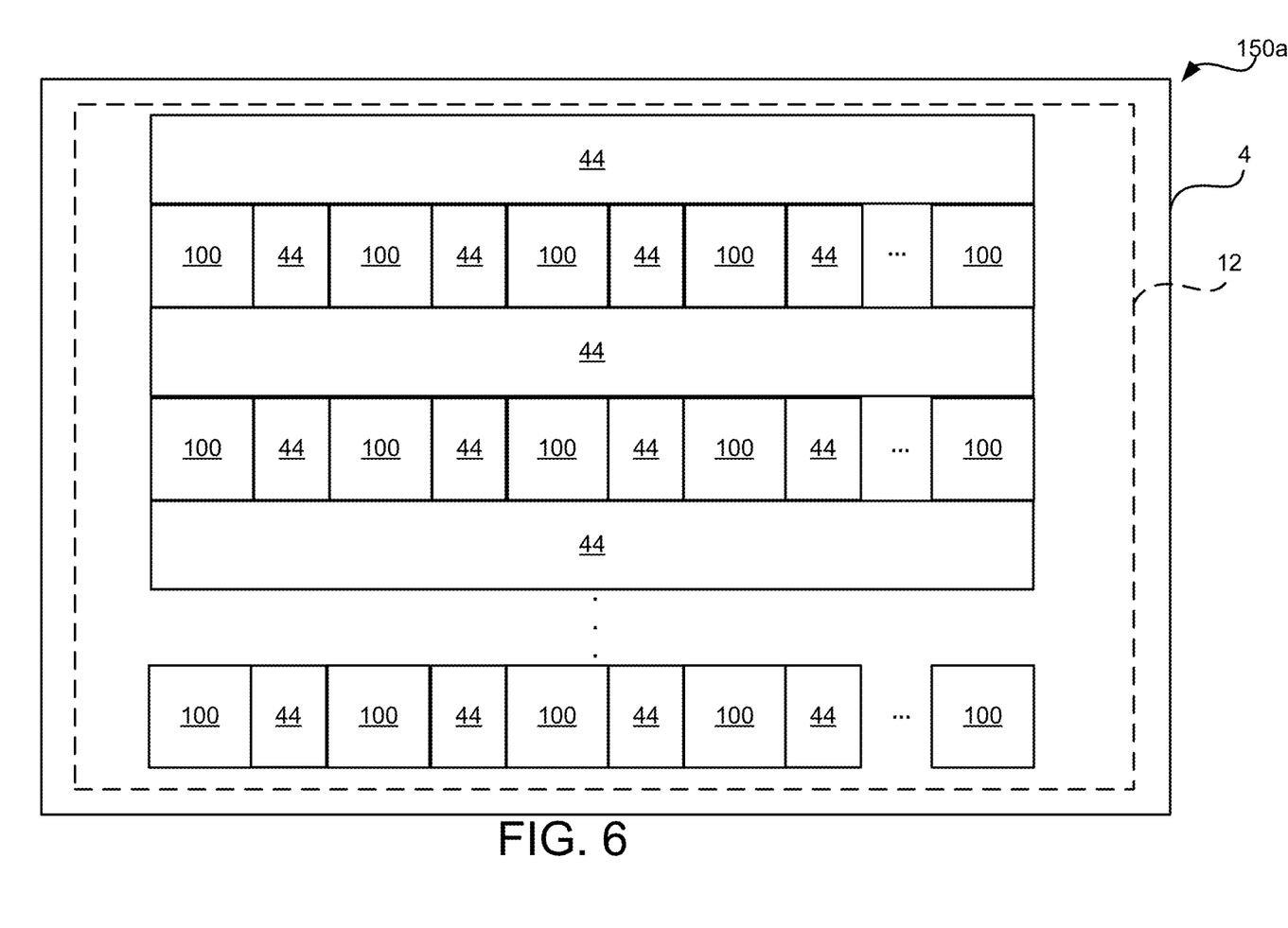
FIG. 6 provides a schematic diagram of a grid-array of stacked spin torque oscillation generators, in accordance with some embodiments.

FIG. 6 provides a schematic diagram of a grid-array 150a of stacked microwave generators 100, in accordance with some embodiments. The stacked microwave generators 100 are similar to the stacked microwave generator 100 described in conjunction with FIG. 3, and similar description is not repeated herein. A first electrode 4 (shown in phantom) and a second electrode 12 of the grid-array 150a includes a continuous thin-film that couples each of the stacked microwave generators 100 in parallel. An insulator 44 can be located between each of the stacked microwave generators 100 to electrically isolate each of the stacked microwave generators 100. In some embodiments, each of the stacked microwave generators 100 include spin torque oscillation generators 2a-2c configured to generate a substantially similar spin torque output signal such that the microwave output of each of the stacked microwave generators 100 is additive. For example, for a 1 in×1 in array having a pitch of 40 nm, there are about $4 \times 10^{10}$ spin-torque oscillation generators 2 in a single layer. In some embodiments, each of the spin torque oscillation generators 2 generate 0.1 nW of microwave energy. A single layer of the 1 in×1 in array provides 40 W of microwave energy. For a 3D stacked grid-array 100b having, for example, 100 layers, a 4 kW microwave output signal can be generated. As another example, for micro-sized applications, a 10 micrometer×10 micrometer array having a pitch of 40 nm and 100 layers can generate a microwave output signal of about 0.6 mW. It will be appreciated that the numbers provided herein are illustrative only and that any number of layers, in any sized array, using any suitable pitch, can generate a greater or smaller microwave output signal and is within the scope of this disclosure.

Figure 7:
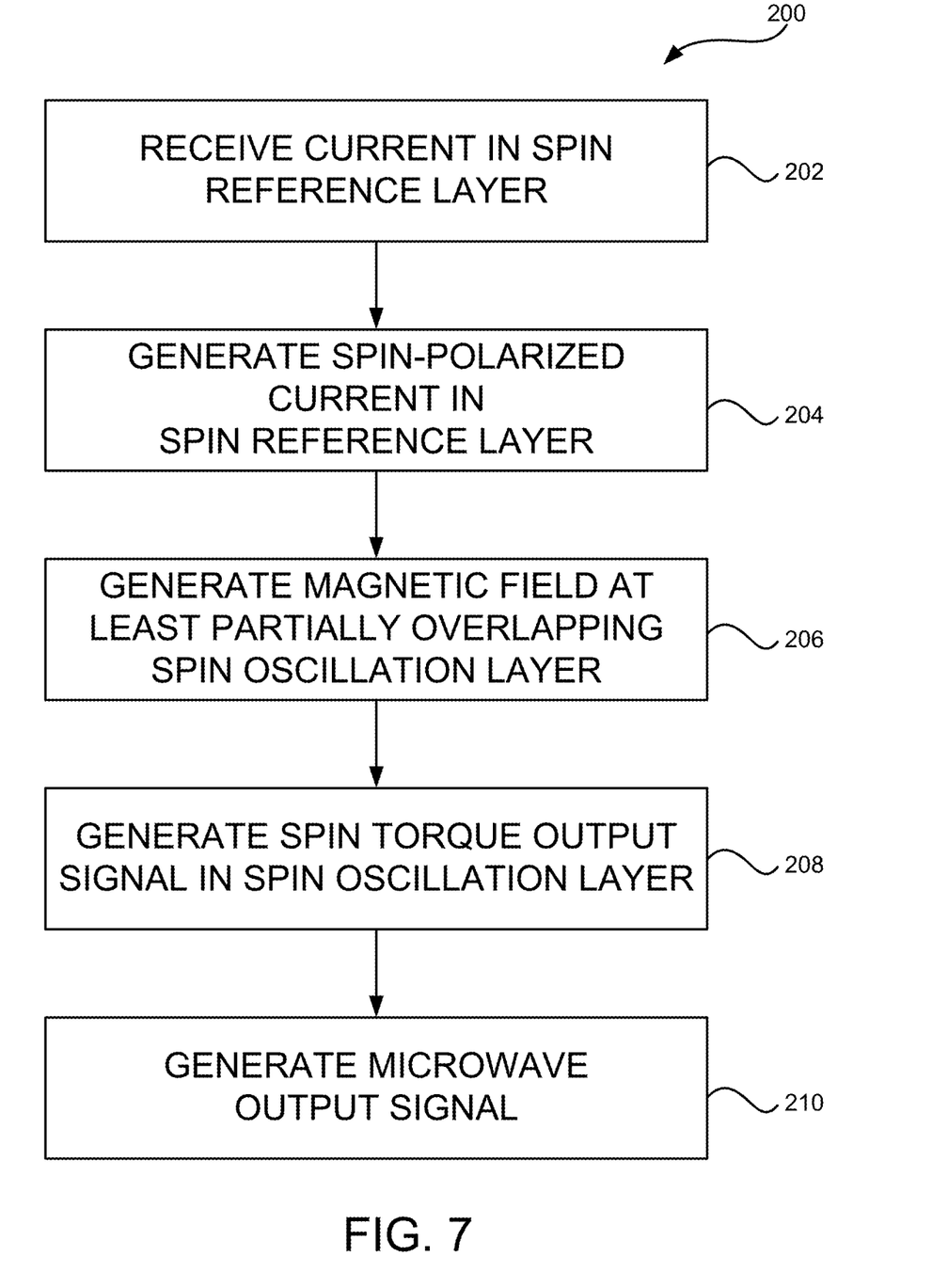
FIG. 7 provides flow diagram for generating a microwave output signal using a first spin torque oscillation generator and a second spin torque oscillation generator, in accordance with some embodiments.

FIG. 7 is a flow diagram 200 for generating a microwave output signal using at least a first spin torque oscillation generator and a second spin torque oscillation generator. At 202, a current is received at a spin reference layer 6. The current 22 can be received from a first electrode 4 coupled to the spin reference layer 6. The spin reference layer 6 may be a permanent magnetic material having a first magnetization direction 18. At 204, a spin-polarized current is generated by filtering the current 22 through the spin reference layer 6. The spin reference layer 6 filters the current 22 by allowing electrons having a spin direction substantially the same as the first magnetization direction 18 to pass through while reflecting electrons having a spin direction substantially opposite the first magnetization direction 18.

At 206, an external magnetic field 34 can be generated and applied to a spin oscillation layer 10. The external magnetic field 34 can be generated by any suitable magnetic element, such as a permanent magnet, an electromagnet, a current wire, and/or any other suitable element. The magnetic field 34 aligns a second magnetization direction of the spin oscillation layer 10 in a predetermined direction such that an angle of difference between the first magnetization direction 18 and the second magnetization direction is within a range of 0° to 180°. In some embodiments, the external magnetic field 34 is omitted.

At 208, an electromagnetic wave output signal is generated in the spin oscillation layer 10. The spin torque output signal is generated by providing the spin-polarized current to the spin oscillation layer 10. The spin-polarized current generates a spin torque on the spins in the spin oscillation layer 10. The spin torque is related to an angle of difference between the first magnetization direction 18 of the spin reference layer 6 and the second magnetization direction 20 of the spin oscillation layer 10. The spin torque causes precession of the spins within the spin oscillation layer 10. The precession of the spins generates electromagnetic wave output signal. At step 210, a microwave output signal is generated by aggregating each of the electromagnetic wave output signals generated by the first and second spin torque oscillation generators.

While some particular embodiments have been described and/or illustrated herein, and while these particular embodiments have been described and/or illustrated in considerable detail, it is not the intention of the applicant(s) for these particular embodiments to limit the concepts presented herein. Additional adaptations and/or modifications may readily appear to persons having ordinary skill in the art, and, in broader aspects, these adaptations and/or modifications may be encompassed as well. Accordingly, departures may be made from the foregoing embodiments without departing from the scope of the concepts presented herein, which scope is limited only by the following claims when appropriately construed.

What is claimed is:

1. An apparatus, comprising:
a first spin reference layer comprising $L1_0$-phased hard magnetic alloy and having a first magnetization direction normal to the layer, the first spin reference layer configured to receive a current normal to the layer and pass electrons having a spin direction substantially similar to the first magnetization direction that generates a spin-polarized current; and
a first spin oscillation layer comprising a negative magnetic anisotropy material and having a second magnetization direction, wherein the second magnetization direction is different than the first magnetization direction, wherein the first spin oscillation layer is configured to receive the spin-polarized current from the first spin reference layer, wherein the spin-polarized current generates a spin torque output signal based on the second magnetization direction of the first spin oscillation layer;
a second spin reference layer separated from the first spin oscillation layer through an exchange breaking layer comprising face-centered cubic (FCC) structure, wherein the second spin reference has a third magnetization direction normal to the layer, the second spin reference layer configured to receive the spin torque output signal from the first spin oscillation layer and pass electrons having spin direction substantially similar to the third magnetization direction that generates another spin-polarized current; and
a second spin oscillation layer having a fourth magnetization direction, wherein the fourth magnetization direction is different than the third magnetization direction, wherein the second spin oscillation layer is configured to receive the another spin-polarized current from the second spin reference layer, wherein the another spin-polarized current generates another spin torque output signal based on the fourth magnetization direction of the second spin oscillation layer, and wherein the another spin torque output signal generates another microwave output signal.

2. The apparatus of claim 1 further comprising:
a second exchange breaking layer configured to magnetically decouple the first spin reference layer from the first spin oscillation layer.

3. The apparatus of claim 2, wherein the second exchange breaking layer is selected from the group consisting of a silver-alloy, a copper-alloy, and a gold-alloy.

4. The apparatus of claim 1, wherein a difference between a magnetization angle of the first magnetization direction and the second magnetization direction ranges between 0° and 90°.

5. The apparatus of claim 1, wherein a frequency associated with the microwave output signal is adjustable through application of an external magnetic field to the apparatus.

6. The apparatus of claim 5, wherein the external magnetic field partially overlaps the first spin oscillation layer, and wherein the second magnetization direction is aligned in a same magnetization direction as the external magnetic field.

7. The apparatus of claim 1, wherein a frequency associated with the microwave output signal is adjustable by varying a density associated with the current.

8. The apparatus of claim 1, comprising a transmitter coupled to the second spin oscillation layer, wherein the transmitter is configured to transmit the microwave output signal.

9. The apparatus of claim 1, wherein the first spin reference layer generates a spin-polarized current by filtering electrons having a first spin direction substantially similar to the first magnetization direction and scattering electrons having a second spin direction substantially opposite to the first magnetization direction.

10. The apparatus of claim 1, wherein the first spin reference layer is selected from the group consisting of a copper-platinum alloy, and an iron-platinum alloy.

11. The apparatus of claim 1, wherein the first spin oscillation layer is selected from the group consisting of a nickel-alloy, an iron-alloy, and a cobalt-alloy.

12. A system, comprising:
a first spin torque oscillation generator and a second spin torque oscillation generator, wherein an insulator comprising oxide is positioned between the first spin torque oscillation generator and the second spin torque oscillation generator, wherein the insulator electrically insulates the first spin torque oscillation generator from the second spin torque oscillation generator, and wherein each spin torque oscillation generator comprises:
a spin reference layer comprising $L1_0$-phased hard magnetic alloy and having a first magnetization direction normal to the layer, the spin reference layer configured to receive a current normal to the layer and generate a spin-polarized current from electrons having a spin direction substantially similar to the first magnetization direction; and a spin oscillation layer comprising a negative magnetic anisotropy material and having a second magnetization direction, wherein the second magnetization direction is different than the first magnetization direction, wherein the spin oscillation layer is configured to receive the spin-polarized current from the spin reference layer, wherein the spin-polarized current generates a spin torque based on the second magnetization direction of the spin oscillation layer, and wherein the spin torque generates a microwave output signal, the first spin torque oscillation generator stacked with the second spin torque oscillation generator with the spin oscillation layer of the first spin torque oscillation generator closer to the spin reference layer of the second spin torque oscillation generator than to any other layer of the second spin torque oscillation generator, wherein a first magnetization angle between the first magnetization direction and the second magnetization direction of the first spin torque oscillation generator and a second magnetization angle between the first magnetization direction and the second magnetization direction of the second spin torque oscillation generator are configured such that the microwave output signal of each of the first and second spin torque oscillation generators are substantially additive; and a transmitter coupled to the first spin torque oscillation generator and the second spin torque oscillation generator.

13. The system of claim 12, wherein first magnetization angle is substantially equal to the second magnetization angle.

14. The system of claim 12, wherein each of the first magnetization angle and the second magnetization angle ranges between 0° and 90°.

15. The apparatus of claim 12, wherein each of the first and second spin torque oscillation generators comprises an exchange breaking layer configured to magnetically decouple the spin reference layer from the spin oscillation layer.

16. The apparatus of claim 12, comprising at least one magnetic field generator configured to generate a magnetic field at least partially overlapping the spin oscillation layer of each of the first and second spin torque oscillation generators, and wherein the second magnetization direction is determined by the magnetic field.

17. The apparatus of claim 16, wherein each of the first and second spin torque oscillation generators comprises a magnetic field generator, and wherein each of the magnetic field generators generate a magnetic field configured to substantially align the second magnetization direction of each of the spin oscillation layers.

18. The apparatus of claim 12 further comprising a third spin torque oscillation generator, wherein the third spin torque oscillation generator comprises a spin reference layer and a spin oscillation layer, wherein the first spin torque oscillation generator and the third spin torque oscillation generator are coupled in series.

* * * * *